United States Patent
Machnicki et al.

(10) Patent No.: US 9,354,658 B2
(45) Date of Patent: May 31, 2016

(54) METHOD FOR ASYNCHRONOUS GATING OF SIGNALS BETWEEN CLOCK DOMAINS

(71) Applicant: Apple Inc., Cupertino, CA (US)

(72) Inventors: Erik P. Machnicki, San Jose, CA (US); Shane J. Keil, San Jose, CA (US)

(73) Assignee: Apple Inc., Cupertino, CA (US)

( * ) Notice: Subject to any disclaimer, the term of this patent is extended or adjusted under 35 U.S.C. 154(b) by 2 days.

(21) Appl. No.: 14/468,982

(22) Filed: Aug. 26, 2014

(65) Prior Publication Data

US 2015/0323960 A1 Nov. 12, 2015

Related U.S. Application Data

(60) Provisional application No. 61/990,904, filed on May 9, 2014.

(51) Int. Cl.
*G06F 1/12* (2006.01)
*H03K 5/01* (2006.01)
*H03K 5/00* (2006.01)

(52) U.S. Cl.
CPC .. *G06F 1/12* (2013.01); *H03K 5/01* (2013.01); *H03K 2005/00013* (2013.01)

(58) Field of Classification Search
CPC ............... G06F 1/10; G06F 1/12; G06F 1/07; H03K 5/01; H03K 3/012; H03K 17/302; H03L 7/00
USPC ................................. 327/99, 113, 291, 299
See application file for complete search history.

(56) References Cited

U.S. PATENT DOCUMENTS

| | | | | |
|---|---|---|---|---|
| 7,733,129 B2 * | 6/2010 | Chang | ........................ | G06F 1/04 326/93 |
| 7,911,240 B1 * | 3/2011 | Lai | ............................ | G06F 1/10 327/298 |
| 7,944,241 B1 * | 5/2011 | Sharma | ...................... | G06F 1/10 326/16 |
| 8,611,178 B2 | 12/2013 | Deivasigamani | | |
| 8,707,080 B1 | 4/2014 | McLamb | | |
| 2013/0314134 A1 * | 11/2013 | Kulmala | .................. | H03L 7/00 327/155 |

* cited by examiner

*Primary Examiner* — John Poos
(74) *Attorney, Agent, or Firm* — Meyertons, Hood, Kivlin, Kowert & Goetzel, P.C.

(57) ABSTRACT

An apparatus for synchronizing a signal from a first clock domain into a second clock domain is disclosed. The apparatus may include circuitry, a synchronization circuit, and a clock gate circuit. The circuitry may de-assert a first enable signal dependent upon a first clock signal. The synchronization circuit may generate a second enable signal synchronized to a second clock signal and may de-assert the second enable signal in response to de-asserting the first enable signal. The clock gate circuit may generate a third clock signal dependent upon the second clock signal, and may disable the third clock signal responsive to de-asserting the second enable signal. The circuitry may further disable the second clock signal in response to determining a predetermined period of time has elapsed since de-asserting the first enable signal.

20 Claims, 6 Drawing Sheets

METHOD FOR ASYNCHRONOUS GATING OF SIGNALS BETWEEN CLOCK DOMAINS

PRIORITY CLAIM

This application claims the benefit of U.S. Provisional Patent Application No. 61/990,904, filed on May 9, 2014, and whose disclosure is incorporated herein by reference.

BACKGROUND

1. Technical Field

Embodiments described herein are related to the field of integrated circuit implementation, and more particularly to the implementation of clock synchronization circuits.

2. Description of the Related Art

Computing systems may include one or more systems-on-a-chip (SoCs), which may integrate a number of different functions, such as, graphics processing, onto a single integrated circuit. With numerous functions included in a single integrated circuit, chip count may be kept low in mobile computing systems, such as tablets, for example, which may result in reduced assembly costs, and a smaller form factor for such mobile computing systems.

System-on-a-chip (SoC) designs may have multiple clock sources, each operating at a different frequency to support one or more functions. A given functional block within an SoC, such as, for example, an Universal Serial Bus (USB) module, an Ethernet module, a graphics processor, or an audio processor, may utilize two or more clock signals with different frequencies for proper operation. In such cases, logic that is clocked by the clock signal with a slower frequency may need to enable or disable a local portion of the clock signal with a higher frequency. To avoid clock glitches and/or a metastable signal, the enable signal from the slow frequency clock domain may be synchronized to the high frequency clock domain by using a synchronizing circuit. When the local high frequency clock is disabled within the functional block, a global version of the high frequency clock may continue to clock the synchronizing circuit, which may consume power needlessly.

SUMMARY OF THE EMBODIMENTS

Various embodiments of a synchronizing circuit are disclosed. Broadly speaking, a system, an apparatus, and a method are contemplated in which the apparatus includes circuitry coupled to a synchronization circuit and a clock gate circuit. The circuitry may generate a first enable signal dependent upon a first clock signal and may generate a second clock signal. A frequency of the second clock signal may be greater than a frequency of the first clock signal. The synchronization circuit may generate a second enable signal synchronized to the second clock signal and may de-assert the second enable signal in response to a determination that the first enable signal has been de-asserted. The clock gate circuit may generate a third clock signal dependent upon the second clock signal and may disable the third clock signal responsive to the de-assertion of the second enable signal. The circuitry may also disable the second clock signal in response to a determination that a first predetermined period of time has elapsed since the first enable signal has been de-asserted.

In a further embodiment, to determine that the first predetermined period of time has elapsed, the circuitry may determine that the second enable signal has been de-asserted. In another embodiment, the circuitry may include a delay circuit, and to determine that the first predetermined period of time has elapsed, the circuitry may delay the first enable signal using the delay circuit.

In one embodiment, the synchronization circuit may include a plurality of flip-flops. In another embodiment, the first predetermined period of time may be programmable.

In a given embodiment, the circuitry may assert the first enable signal dependent upon the first clock signal and may enable the second clock signal in response to a determination that the first enable signal has been asserted. The synchronization circuit may assert the second enable signal responsive to a determination that a second predetermined period of time has elapsed since the assertion of the first enable signal. In this embodiment, the clock gate circuit may enable the third clock signal in response to the assertion of the second enable signal. In a further embodiment, the first predetermined period of time and the second predetermined period of time may be equal.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A system on a chip (SoC) may include one or more functional blocks, such as, e.g., a processor and one or more memories, which may integrate the function of a computing system onto a single integrated circuit. In some SoC designs, multiple clock signals may be included as required to support various features of the SoC. Each clock signal may operate at a different frequency to support one or more functions. A given functional block within an SoC may require two or more clock signals for proper operation. In such cases, logic that is clocked by the clock signal with a slower frequency may need to enable or disable a local version of the clock signal with a higher frequency. An issue with enabling a clock signal using circuitry from a slower clock domain is that the enable signal transitions asynchronously to the higher frequency clock, which may result in occurrences of clock glitching or metastability in the logic. A more detailed description of metastability will be presented later.

To avoid clock glitching and metastable states, synchronous circuits may be utilized in which a common clock source may be used for any latched signals within the circuit. Through proper timing analysis, a synchronous circuit may be designed in which input signals transition with enough time to settle before being clocked by a latch circuit.

When multiple clock sources are utilized, however, common signals may be needed by circuits clocked by a first clock, i.e., a first clock domain, and circuits clocked by a second clock, i.e., a second clock domain. If the first and second clocks run asynchronously, then a signal traveling from the first clock domain to the second clock domain may transition asynchronously to the second clock. In order to prevent the metastable condition just described, the signal may be synchronized to the second clock domain, through the use of a synchronization circuit. The synchronization circuit may receive the asynchronous signal as an input and adjust the timing of transitions to generate a synchronized version of the signal that meets the timing requirements of the second clock domain. The synchronization circuit may use the second clock to synchronize the asynchronous signal. When the asynchronous signal is not required, the output of the synchronization circuit may be gated to reduce power. However, to meet timing requirements, the synchronization circuit may continue to receive the second clock signal and therefore may consume unnecessary power and create unwanted electromagnetic noise in the system due to the continued switching of clock inputs in the synchronization circuit.

A method and apparatus are desired to reduce unnecessary power consumption within a synchronizing circuit. Such a method must not compromise performance or reliability of associated circuits. Various embodiments of a synchronizing circuit and methods to reduce propagation of gated signals are discussed in this disclosure. The embodiments illustrated in the drawings and described below may provide techniques for managing a synchronizing circuit within a computing system that may reduce switching noise and power consumption from unnecessary clock propagation in an SoC.

System-on-a-Chip Overview

Figure 1:
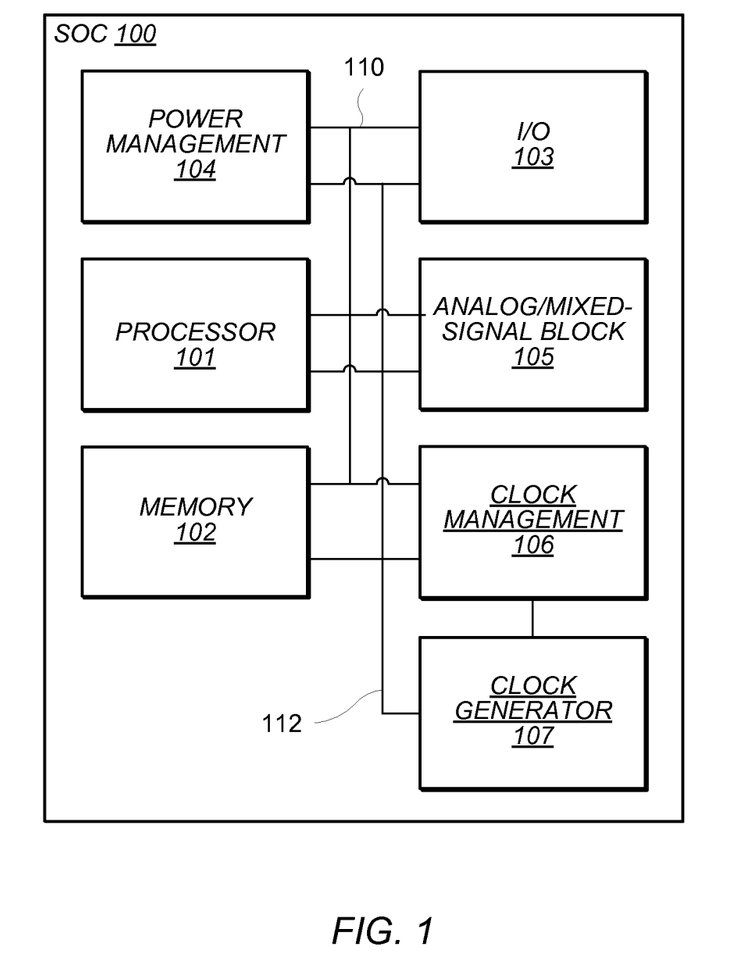
FIG. 1 illustrates an embodiment of a system-on-a-chip (SoC).

A block diagram of an embodiment of an SoC is illustrated in FIG. 1. In the illustrated embodiment, the SoC 100 includes a processor 101 coupled to memory block 102, I/O block 103, power management unit 104, analog/mixed-signal block 105, clock management unit 106, all coupled through bus 110. In various embodiments, SoC 100 may be configured for use in a mobile computing application such as, e.g., a tablet computer or smartphone.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores and may include one or more register files and memories.

In various embodiments, processor 101 may implement any suitable instruction set architecture (ISA), such as, e.g., PowerPC™, or x86 ISAs, or combination thereof. Processor 101 may include one or more bus transceiver units that allow processor 101 to communication to other functional blocks within SoC 100 such as, memory block 102, for example.

Memory block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), resistive RAM (RRAM or ReRAM), or a Magnetoresistive Random Access Memory (MRAM), for example. Some embodiments may include a single memory, such as memory block 102 and other embodiments may include more than two memory blocks (not shown). In some embodiments, memory block 102 may be configured to store program instructions that may be executed by processor 101. Memory block 102 may, in other embodiments, be configured to store data to be processed, such as graphics data, for example.

I/O block 103 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 103 may be configured to implement a version of Universal Serial Bus (USB) protocol, IEEE 1394 (Firewire®) protocol, or, and may allow for program code and/or program instructions to be transferred from a peripheral storage device for execution by processor 101. In one embodiment, I/O block 103 may be configured to perform the data processing necessary to implement an Ethernet (IEEE 802.3) networking standard.

Power management unit 104 may be configured to manage power delivery to some or all of the functional blocks included in SoC 100. Power management unit 104 may comprise sub-blocks for managing multiple power supplies for various functional blocks. In various embodiments, the power supplies may be located in analog/mixed-signal block 105, in power management unit 104, in other blocks within SoC 100, or come from external to SoC 100, coupled through power supply pins. Power management unit 104 may include one or more voltage regulators to adjust outputs of the power supplies to various voltage levels as required by functional blocks within SoC 100.

Analog/mixed-signal block 105 may include a variety of circuits including, for example, a crystal oscillator, a phase-locked loop (PLL) or frequency-locked loop (FLL), an analog-to-digital converter (ADC), and a digital-to-analog converter (DAC) (all not shown). In some embodiments, analog/mixed-signal block 105 may also include, in some embodiments, radio frequency (RF) circuits that may be configured for operation with cellular telephone networks. Analog/mixed-signal block 105 may include one or more voltage regulators to supply one or more voltages to various functional blocks and circuits within those blocks.

Clock management unit 106 may be configured to enable, configure and manage outputs of one or more clock sources, such as, for example clock generator 107. In various embodiments, the clock sources may be located in analog/mixed-signal block 105, in clock management unit 106, in other blocks with SoC 100, or come from external to SoC 100, coupled through one or more I/O pins. In some embodiments, clock management 106 may be capable of dividing a selected clock source before it is distributed throughout SoC 100. Clock management unit 106 may include registers for selecting an output frequency of a PLL, FLL, or other type of adjustable clock source.

SoC 100 may also include clock generator 107. Clock generator 107 may be a sub-module of analog/mixed signal block 105 or clock management unit 106. In other embodiments, clock generator 107 may be a separate module within SoC 100. One or more clock sources may be included in clock generator 107. In some embodiments, clock generator 107 may include PLLs, FLLs, internal oscillators, oscillator circuits for external crystals, etc. One or more clock signal outputs 112 may provide clock signals to the functional blocks of SoC 100.

System bus 110 may be configured as one or more buses to couple processor 101 to the other functional blocks within the SoC 100 such as, e.g., memory block 102, and I/O block 103. In some embodiments, system bus 110 may include interfaces coupled to one or more of the functional blocks that allow a particular functional block to communicate through the bus. In some embodiments, system bus 110 may allow movement of data and transactions (i.e., requests and responses) between functional blocks without intervention from processor 101. For example, data received through the I/O block 103 may be stored directly to memory block 102.

It is noted that the SoC illustrated in FIG. 1 is merely an example. In other embodiments, different functional blocks and different configurations of functions blocks may be possible dependent upon the specific application for which the SoC is intended. It is further noted that the various functional blocks illustrated in SoC 100 may operate at different clock frequencies.

Clock Domains within an SoC

Figure 2:
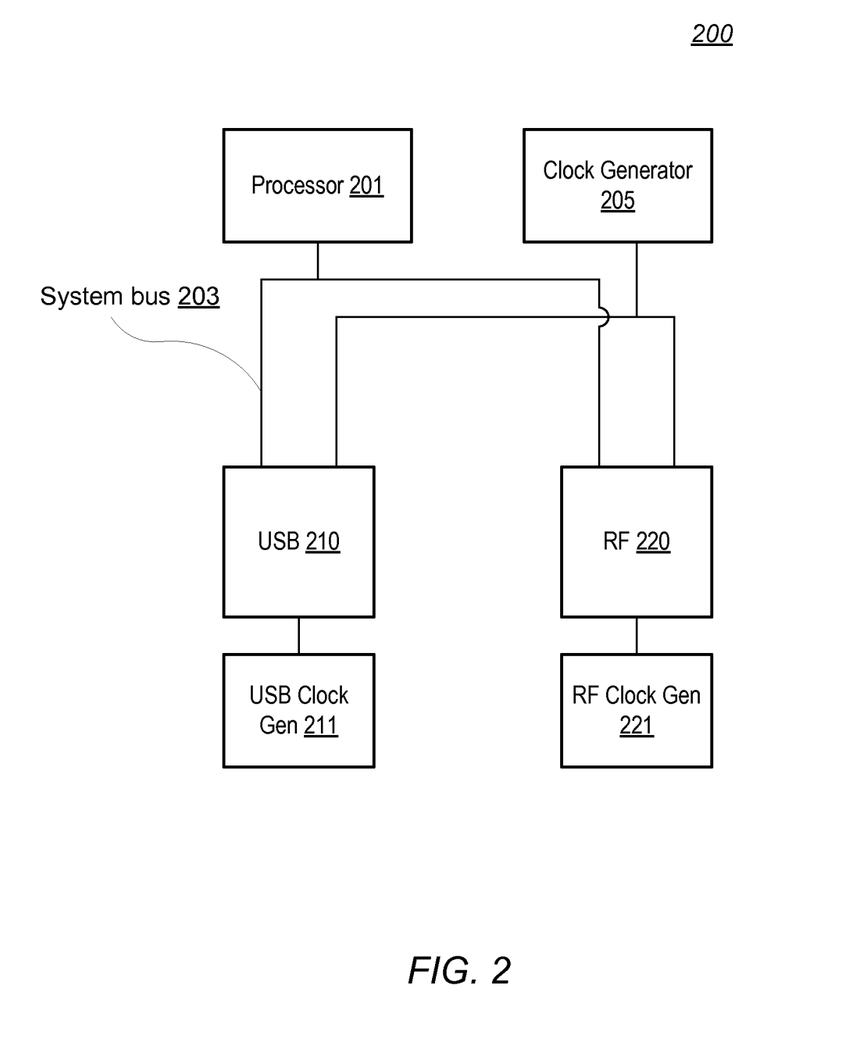
FIG. 2 illustrates an embodiment of a block diagram of clocking scheme for functional blocks of an SoC.

Turning to FIG. 2, an embodiment of a block diagram of clocking scheme for functional blocks of an SoC. System 200 may include processor 201 coupled to Universal Serial Bus (USB) 210 and radio frequency link (RF) 220 through system bus 203. System 200 may also include clock generator 205, also coupled to USB 210 and RF 220. USB 210 may also be coupled to USB clock generator 211 and RF clock generator 221.

Processor 201 may correspond to processor 101 in FIG. 1 and therefore function as previously described. In addition, processor 201 may utilize USB 210 and RF 220 to send and receive data to other devices. Communication between processor 201, USB 210 and RF 220 may occur through system bus 203 and may occur at a data rate based on clock generator 205. In some embodiments, system bus 203 may utilize clock generator 205 to set a data rate. In other embodiments, system bus 203 may utilize a clock signal at a different frequency, but derived from clock generator 205 and, therefore, synchronous to clock generator 205.

Clock generator 205 may provide a clock signal usable by processor 201, USB 210, and RF 220, as well as by other functional blocks not illustrated in FIG. 2. In various embodiments, clock generator 205 may output a single clock signal or may provide multiple, synchronous clock signals generated from a common clock source. Clock generator 205 may be a programmable PLL, DLL, or FLL, or may be a fixed frequency clock.

USB 210 may include circuitry necessary to implement one or more USB protocols such as USB 1.1, USB 2.0, or USB 3.0. In some embodiments, USB 210 may include circuitry on more than one die to implement the supported protocols. USB 210 may utilize a clock signal provided by clock generator 205 to clock logic circuits in one part of the module, such as control logic and an interface to system bus 203. USB 210 may require a second clock signal provided by USB clock generator 211 to clock a second part of the module, such as a physical interface to another USB device. In some embodiments, USB clock generator 211 may include a PLL and a clock source such as a quartz crystal. A clock signal generated by USB clock generator 211 may operate independently from and asynchronously to the clock signal provided by clock generator 205.

RF 220 may include circuitry necessary to implement one or more wireless RF standards such as, for example, Wi-Fi™, Bluetooth™, Global System for Mobile Communications (GSM), or Code Division Multiple Access (CDMA). Similar to USB 210, RF 220 may include circuitry on more than one die to implement the supported standards. Also like USB 210, RF 220 may utilize a first clock signal from clock generator 205 for a first part of the module and a second clock signal for a second part of the circuit. RF clock generator 221 may provide the second clock signal through use of a clock source such as a quartz crystal which may be coupled to a PLL to generate the second clock signal. Similar to USB clock generator 211, RF clock generator 221 may function asynchronously to clock generator 205.

It is noted that the embodiment of system 200 as illustrated in FIG. 2 is merely an example. The illustration of FIG. 2 has been simplified to highlight features relevant to this disclosure. In other embodiments, additional functional blocks such as memories and analog/mixed signal functions may be included. USB and RF modules are used solely as example functional blocks. Various embodiments may include any number and types of functional blocks.

As used herein, "synchronous" or "synchronizing" may refer to a timing relationship between transitions of two or more signals. A plurality of signals may be considered synchronous if transitions of the signals occur responsive to a common event, such as, for example, a falling edge of a common clock signal. Due to process variations and gate delays through digital circuits, synchronous signals may not all transition at an exact same point in time, yet may still be considered synchronous if their transitions occur within a consistent time of one another. Asynchronous signals may not share a common clock signal or other event to establish synchronicity. Asynchronous signals may, therefore, transition seemingly at random to each other. In other words, asynchronous signals may lack a common point of reference for timing of signal transitions.

Figure 3:
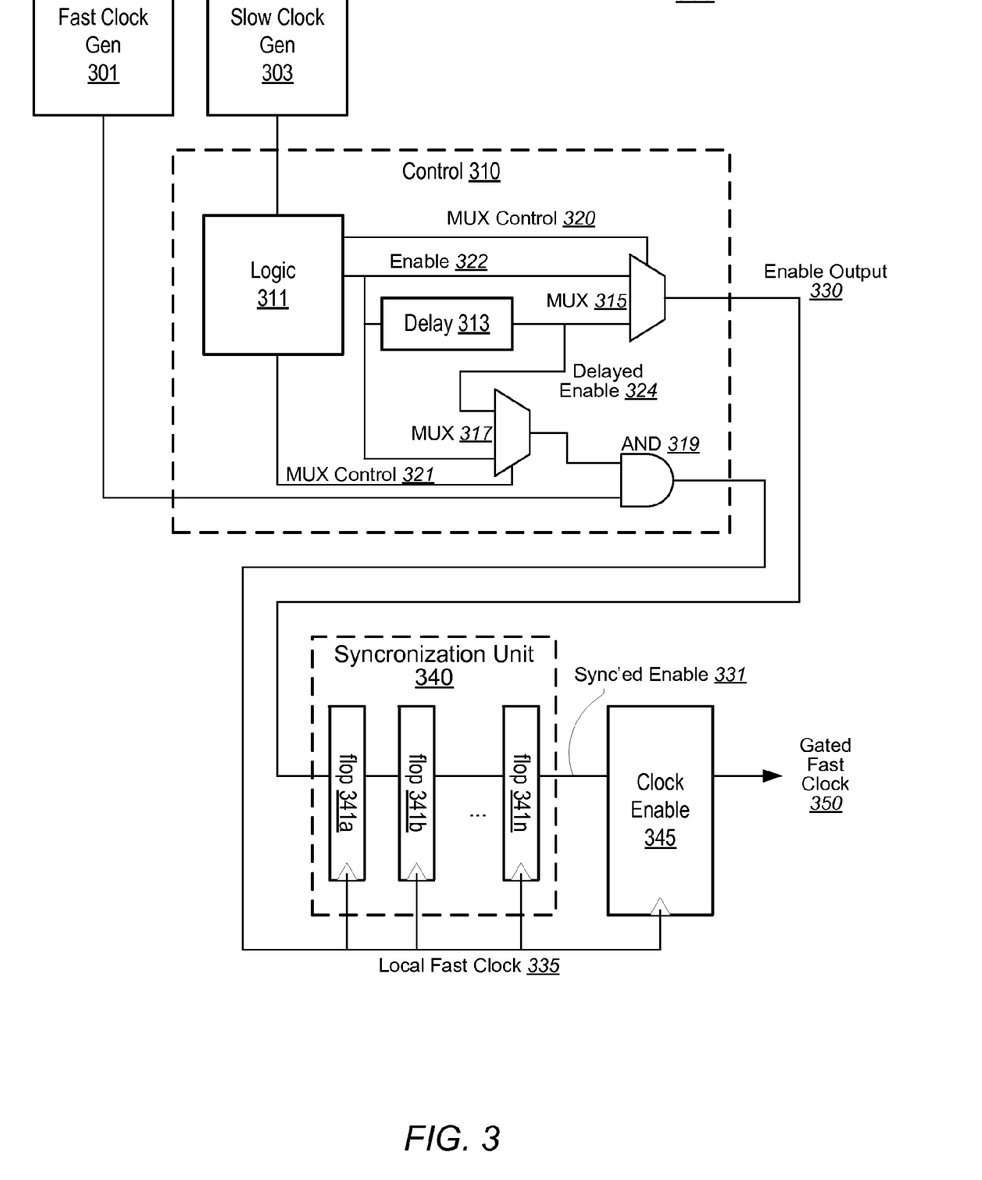
FIG. 3 illustrates a block diagram of an embodiment of a synchronization system.

Moving to FIG. 3, a block diagram of an embodiment of a synchronization system is illustrated. A system, such as synchronization system 300, may be used in functional blocks such as, e.g., USB 210 or RF 220 as illustrated in FIG. 2 or any other suitable functional block, to synchronize a signal generated in one clock domain for use in another, asynchronous clock domain. For example, synchronization system 300 may be used to synchronize an enable signal for a fast clock gating circuit using a clock from a slow clock domain. Synchronization system 300 may include fast clock generator 301 and slow clock generator 303, both coupled to control circuit 310. Control circuit 310 may be further coupled to synchronization unit 340 through enable output 330 and local fast clock 335 and coupled to clock enable 345 through local fast clock 335. Synchronization unit 340 may be coupled to clock enable 345 through synchronized enable 331.

In some embodiments, fast clock generator 301 may correspond to clock generator 205 in FIG. 2 and slow clock generator 303 may correspond to USB clock generator 211. A fast clock signal from fast clock generator 301 may be globally distributed across an SoC such as SoC 100 in FIG. 1. A slow clock signal from slow clock generator 303 may run asynchronously to the fast clock signal from fast clock generator 301 and control circuit 310 may be used to synchronize an enable signal generated in the slow clock signal domain such that the enable signal may be used in the fast clock signal domain.

Control circuit 310 may operate in the slow clock signal domain and may control the assertion and de-assertion of enable output 330. In some embodiments, to assert a signal may refer to placing a logic high or logic "1" value on the signal wire and de-asserting a signal may refer to placing a logic low or logic "0" value on the signal wire. In other embodiments, the values may be reversed such that asserting a signal may result in a logic low value on the signal wire and de-asserting may result in a logic high on the wire. In some embodiments, control circuit 310 may gate the global fast clock signal from fast clock generator 301 to create local fast clock 335. Local fast clock 335 may, in some embodiments, remain within a given functional block such as, for example, USB 210.

Control circuit 310 may include logic 311, delay block 313, multiplexing circuit (MUX) 315, MUX 317 and AND gate 319. Logic 311 may determine local fast clock 335 is required and assert enable 322. Enable 322 may be input into delay block 313, creating delayed enable 324. When enable 322 transitions from a de-asserted state to an asserted state, MUX control 320 may configure MUX 315 to pass delayed enable 324 through to enable output 330 and MUX control 321 may configure MUX 317 to pass enable 322 to an input of AND gate 319.

Delay block 313 may delay enable 322 for a predetermined period of time. In some embodiments, the predetermined period of time may be programmable. In such embodiments, the amount of time to delay enable 322 may be determined during a manufacturing test and set before the device is shipped to an end customer. In other embodiments, the amount of time to delay enable 322 may be determined during use of the device based upon any suitable parameters, such as a current operating frequency of one or more clock signals, a current operating temperature, or current operating voltage. Delay block 313 may be implemented as a series of inverter gates or buffers and programmability may be implemented by selecting an output of a given inverter in the series to provide delayed enable 324.

Static complementary metal-oxide-semiconductor (CMOS) inverters, such as those described herein, may be a particular embodiment of an inverting amplifier that may be employed in the circuits described herein. In other embodiments, however, any suitable configuration of inverting amplifier that is capable of inverting the logical sense of a signal may be used, including inverting amplifiers built using technology other than CMOS.

If enable 322 is asserted at the input of AND gate 319, then local fast clock 335 will be enabled. Gated fast clock 350, however, may remain disabled until synchronized enable 331 asserts. If enable output 330 is selected to be delayed enable 324, then synchronization unit 340 may receive local fast clock 335 before enable output 330 is asserted. Delaying enable output 330 for a predetermined period of time after enabling local fast clock 335 may allow synchronization unit 340 time to activate before enable output 330 transitions.

Static AND gates, such as those shown and described herein, may be implemented according to several design styles. For example, an AND gate may be implemented as a NAND gate whose output is coupled to an inverter. In other embodiments, an AND gate may be constructed from multiple NAND gates, multiple NOR gates, or any suitable combination of logic gates.

Synchronization unit 340 may include one or more flip-flops 341a-341n. Flip-flops 341 may be clocked by local fast clock 335. Coupling enable output 330 through flip-flops 341 may synchronize enable output 330 to the fast clock domain, and may, in some embodiments, prevent a clock glitch or metastable state from occurring in the system.

In some embodiments, flip-flops 341 may be implemented as one or more flip-flops. It is noted that flip-flops may be particular embodiments of single data bit storage circuit and may be designed in accordance with one of various design styles. For example, latches and flip-flops may be implemented using either dynamic or static circuits, or a combination thereof. In some embodiments, flip-flops 341 may be implemented using in a technology with transistors with low voltage thresholds. Such low voltage threshold transistors may transition quickly, but may also consume more power than similar transistors with higher voltage thresholds.

It is noted that a "metastable state" or "metastability" herein refers to a condition associated with signals in a digital circuit wherein the circuit may enter a state of unstable equilibrium for an unknown period of time. As an example, a latch or flip-flop circuit may receive an input and retain the value of the input at a time of a falling clock edge. If the state of the input changes close to the time of a falling clock edge, the latch may not be capable of resolving the input value and may enter a state in which the latch output value is neither a high nor a low value, but instead some value in between. The latch circuit may remain in this state for the length of a clock cycle or less, and may eventually resolve to a high or low value. The value may or may not reflect the current state of the input signal.

When enable output 330 asserts after the predetermined period of time elapses, synchronization unit 340 may synchronize the transition on enable output 330 to the fast clock domain of local fast clock 335, creating synchronized enable 331. Assertion of synchronized enable 331 may enable clock enable 345. Once enabled, clock enable 345 may generate gated fast clock 350, dependent upon local fast clock 335.

To disable gated fast clock 350, logic 311 may de-assert enable 322. Upon the de-assertion of enable 322, MUX control 320 may configure MUX 315 to pass enable 322 and MUX control 321 may configure MUX 317 to pass delayed enable 324. Enable output 330 may transition at the input to flip-flops 341 while local fast clock 335 remains enabled. Synchronized enable 331 may transition before the predetermined period of time elapses in delay block 313, thereby de-asserting the input to clock enable 345. Gated fast clock 350 may be disabled upon the de-assertion of synchronized enable 331.

A multiplexing circuit (also referred to as a "multiplexor" or "mux") is a circuit used to select one of two or more input signals to use as an output signal. The multiplexors shown herein, MUX 315 and MUX 317, may be implemented with two inputs and a single output, wherein the output signal is chosen by a single control input signal. For example, enable 322 may be selected as the output of MUX 315 if MUX control 320 is asserted and delayed enable 324 may be selected if MUX control 320 is de-asserted.

After the predetermined period of time elapses in delay 313, delayed enable 324 may de-assert thereby de-asserting the input to AND gate 319. The de-assertion of the input to AND gate 319 may then disable local fast clock 335. By disabling local fast clock 335 after the predetermined time elapses, synchronization unit 340 may have sufficient time to generate synchronized enable 331 before local fast clock 335 is disabled and flip-flops 341 are no longer being clocked. In some embodiments, by reducing the number of circuits being clocked, power may be saved and/or electromagnetic noise may be reduced.

In an alternative embodiment, some or all of control circuit 310 may be implemented in software executed by a processor such as, e.g., processor 101 in FIG. 1. In such an embodiment, control signals enable 322 and delayed enable 324 may be implemented by registers bits and controlled by processor 101. A delay between enable 322 and delayed enable 324 may also be implemented in software as well as MUX 315 and MUX 317.

It is noted that FIG. 3 is merely an example of a synchronization circuit. The illustrated embodiment is simplified for purposes of demonstrating the concepts of the synchronization circuit. Various other embodiments may have more or fewer components and may be configured differently.

Figure 4:
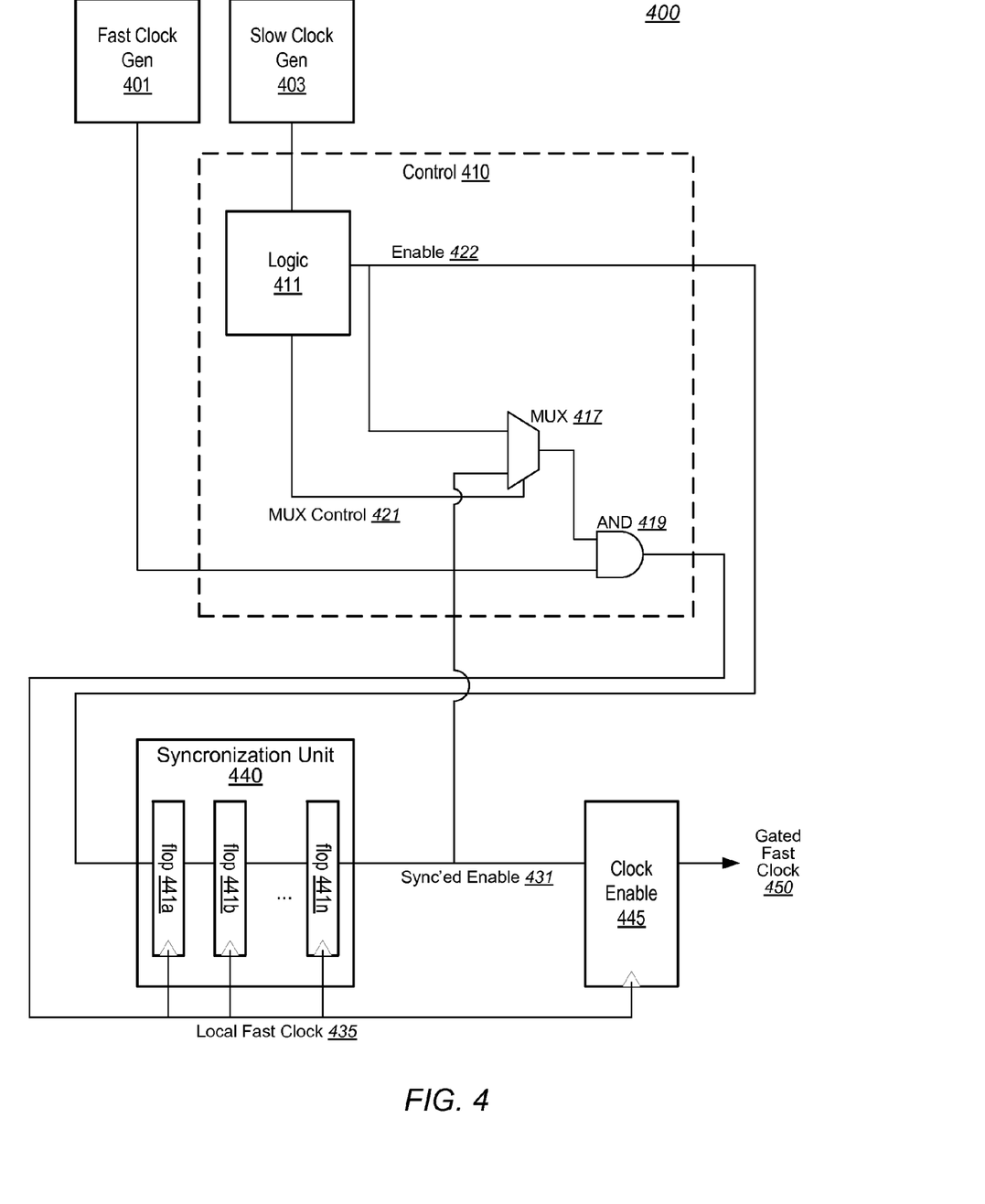
FIG. 4 illustrates a block diagram of another embodiment of a synchronization system.

Turning now to FIG. 4, a block diagram of another embodiment of a synchronization system is illustrated. Similar to system 300 of FIG. 3, synchronization system 400 may be used in functional blocks such as, e.g., USB 210 or RF 220 in FIG. 2, to synchronize a signal generated in one clock domain for use in another, asynchronous clock domain. Synchronization system 400 may include many of the same functional blocks as synchronization system 300, which may function as described above.

Differences between system 300 and system 400 may include that control circuit 410 of synchronization system 400 may not include a delay block such as delay block 313 or a delayed enable signal such as delayed enable 324. In addition, enable 422 may replace enable output 330, thereby eliminating MUX 315 and MUX control 420. In place of a delay block, control circuit 410 may receive a feedback signal from synchronization unit 440. Synchronized enable 431 may replace delayed enable 324 as an input to MUX 417. The following is an example of how synchronized enable 431 may be used in system 400 in place of a delay block.

Fast clock generator 401 may correspond to clock generator 205 in FIG. 2 and slow clock generator 403 may correspond to RF clock generator 221. A slow clock signal from slow clock generator 403 may run asynchronous to the fast clock signal from fast clock generator 401 and control circuit 410 may be used to synchronize an enable signal generated in the slow clock signal domain such that the enable signal may be used in the fast clock signal domain.

Control circuit 410 may operate in the slow clock signal domain and may control the assertion and de-assertion of enable output 430. In some embodiments, control circuit 410 may gate the global fast clock signal from fast clock generator 401 to create local fast clock 435. Local fast clock 435 may, in some embodiments, remain within a given functional block such as, for example, RF 220.

Logic 411 may determine local fast clock 435 is required and assert enable 422. When enable 422 transitions from a de-asserted state to an asserted state, MUX control 421 may configure MUX 417 to pass enable 422 to an input of AND gate 419. Both the input of AND gate 419 and synchronization unit 440 may receive the asserted enable 422. Several factors may determine which block receives the asserted enable 422 first, such as relative impedance in the paths to AND gate 419 and synchronization unit 440. The assertion of enable 422 at the input to AND gate 419 may enable local fast clock 435. Gated fast clock 450, however, may remain disabled until synchronization unit 440 asserts synchronized enable 431.

Depending on the path delays in the system, synchronization unit 440 may receive local fast clock 435 before enable 422 is asserted or synchronization unit 440 may receive asserted enable 422 before local fast clock 435 is enabled. If local fast clock 435 is received first, then enable 422 may start to be synchronized at the first active edge of local fast clock 435 after the transition of enable 422 occurs at the input of synchronization unit 440. If the transition of enable 422 occurs at the input of synchronization unit 440 before local fast clock 435 is enabled, then enable 422 may start to be synchronized at the first active edge of local fast clock 435 is received.

Synchronization unit 440 may synchronize the transition on enable 422 to the fast clock domain of local fast clock 435, creating synchronized enable 431. Assertion of synchronized enable 431 may activate clock enable 445 which, in turn, may generate gated fast clock 450, dependent upon local fast clock 435.

To disable gated fast clock 450, logic 411 may de-assert enable 422. Upon the de-assertion of enable 422, MUX control 421 may configure MUX 417 to pass synchronized enable 431. Since synchronized enable 431 will not de-assert until synchronization unit 440 synchronizes the de-assertion transition, the input to AND gate 419 may remain asserted and local fast clock 435 may remain enabled. Enable 422 may transition at the input to synchronization unit 440 while local fast clock 435 remains enabled. The de-assertion of enable 422 may be synchronized to synchronized enable 431 after one or more cycles of local fast clock 435, thereby de-asserting the input to clock enable 445. Gated fast clock 450 may be disabled upon the de-assertion of synchronized enable 431.

The de-assertion of synchronized enable 431 may de-assert the input to AND gate 419, thereby disabling local fast clock 435. Disabling local fast clock 435 after the de-assertion of enable 422 has been synchronized to synchronized enable 431, may provide enough time for synchronization unit 440 to enter a steady state. In some embodiments, power may be saved and/or electromagnetic noise may be reduced by disabling local fast clock 435 and prevent unnecessary clocking of synchronization unit 440.

Similar to the embodiment of FIG. 3, in another embodiment of FIG. 4, some or all of control circuit 410 may be implemented in software executed by any suitable processor in SoC 100, such as, e.g., processor 101 in FIG. 1. In such an embodiment, control signal enable 422 may be implemented by a registers bit and controlled by processor 101. Synchronized enable 431 may be monitored by processor 101, for example, via a read only status bit coupled to synchronized enable 431.

It is noted that FIG. 4 is merely an example for demonstration purposes. In other embodiments, circuits may be configured differently. Various other embodiments may have a different number of functional blocks.

Methods for Synchronizing Signals Across Clock Domains

Figure 5:
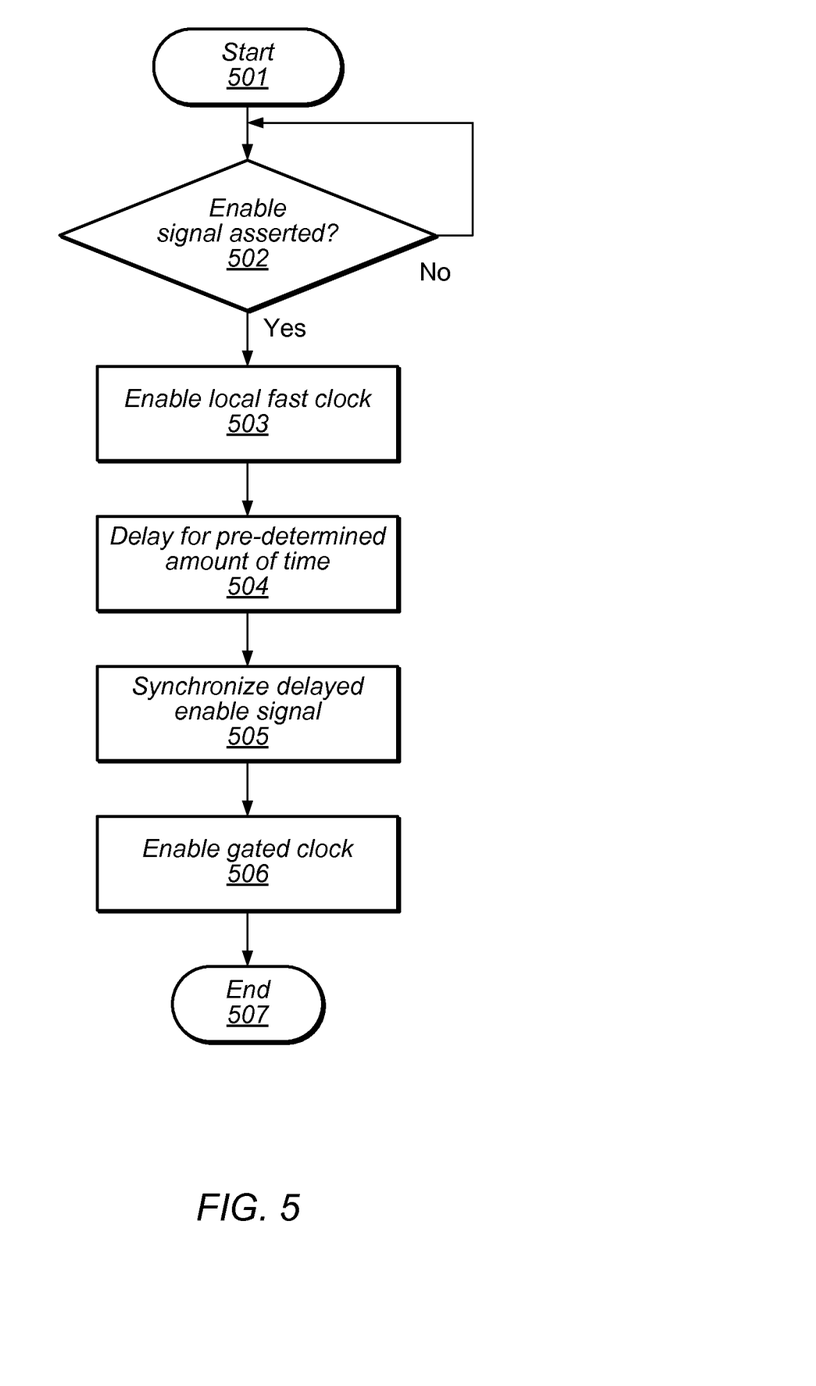
FIG. 5 illustrates a flowchart of an embodiment of a method for enabling a synchronized signal.

Moving now to FIG. 5, a flowchart of an embodiment of a method for synchronizing an assertion of an enable signal is illustrated. The method may be used for a synchronizing circuit such as, e.g., synchronization system 300 in FIG. 3.

Referring collectively to synchronization system 300 in FIG. 3 and the flowchart in FIG. 5, the method may begin in block 501.

Clock signals from two clock generators, such as, e.g., a fast clock signal from fast clock generator 301 and a slow clock signal from slow clock generator 303, may be active. These clock signals may be received by a control circuit of a synchronizing system, such as control circuit 310. An enable signal, such as enable 322 may be in a de-asserted state which may indicate that a local version of the fast clock signal, e.g., local fast clock 335, and a gated version of the fast clock signal, e.g., gated fast clock 350, may both be disabled.

The method may depend upon a state of enable 322 (block 502). Logic 311 in control circuit 310 may determine that gated fast clock 350 needs to be enabled and in response may assert enable 322. The determination that gated fast clock 350 is required may depend upon one or more signals from another functional block in the system. In other embodiments, the determination may be made within logic 311. If enable 322 is not asserted, then the method may remain in block 502.

If enable 322 is asserted, then the method may enable local fast clock 335 (block 503). Local fast clock 335 may be a version of a global fast clock signal from fast clock generator 301. In some embodiments, synchronization system 300 may include a logic gate or a buffer that may allow system 300 to enable or disable a version of the global fast clock signal to create local fast clock 335. The ability to enable and disable local fast clock 335 may reduce power consumption in some embodiments when a fast clock signal is not needed.

A delayed version of enable 322 may be generated after a predetermined period of time (block 504). A delay circuit such as delay block 313 may be used to generate delayed enable 324. In other embodiments, logic circuit 311 may output both enable 322 and delayed enable 324. In such embodiments, delayed enable 324 may be generated by asserting delayed enable 324 a number of slow clock cycles after asserting enable 322. In other embodiments, delayed enable 324 may asserted a partial cycle after enable 322. For example, enable 322 may be asserted on a falling edge of the slow clock signal and delayed enable 324 may be asserted on the following rising edge. In various embodiments, the delay time may be programmable or no delay may be used.

Delayed enable 324 may be synchronized to the local fast clock (block 505). Synchronization unit 340 may be used to synchronize delayed enable 324, creating synchronized enable 331. Synchronization circuit 340 may use one or more flip-flops 341 to synchronize delayed enable 324 to local fast clock 335.

Gated fast clock may be enabled by synchronized enable 331 (block 506). Synchronized enable 331 may be used to enable clock enable 345, which may, in turn, generate gated fast clock 350 dependent upon local fast clock 335. In some embodiments, clock enable 345 may include a latch or buffer to generate gated fast clock 350 from local fast clock 335.

It is noted that the method illustrated in FIG. 5 is merely an example embodiment. Variations on this method are possible. For example, the flowchart in FIG. 5 illustrates operations occurring in series, however, some operations may be performed in parallel or in a different sequence, and additional operations may be included. The method illustrated in FIG. 5 is described in combination with system 300 in FIG. 3, however, in various other embodiments, the method may be applied to the system 400 in FIG. 4 or alternative systems in which some or all of the control logic 310 is implemented in software, i.e., program instruction stored in a non-transitory machine-readable storage medium.

Figure 6:
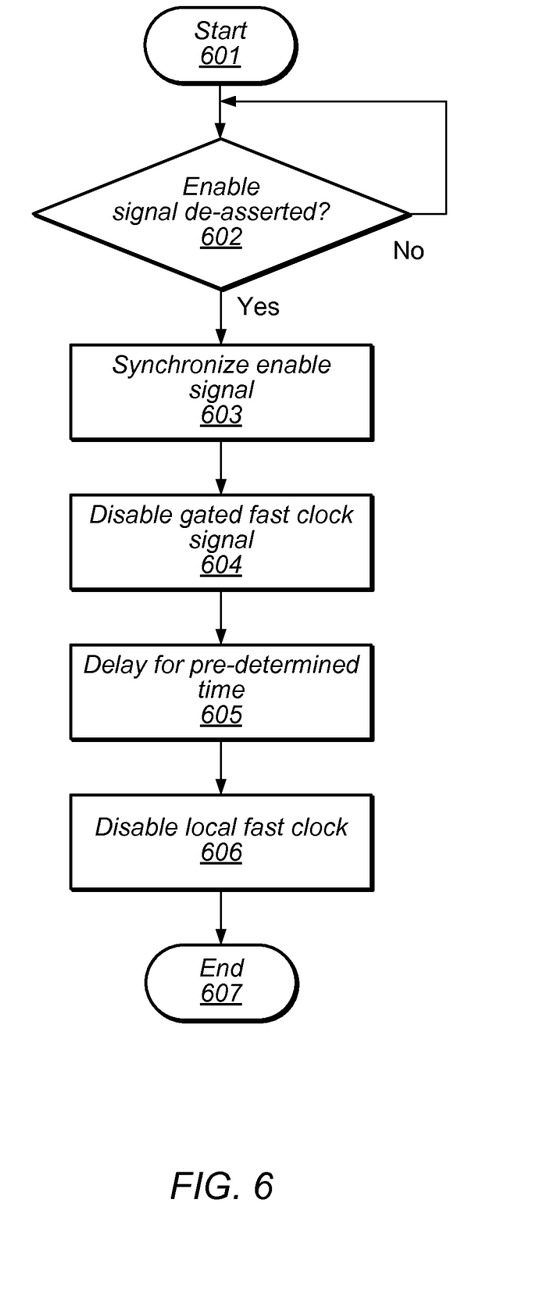
FIG. 6 illustrates a flowchart of an embodiment of a method for disabling a synchronized signal.

Turning to FIG. 6, a method is illustrated for synchronizing a de-assertion of an enable signal. The method may be used for a synchronizing circuit such as, e.g., synchronization system 300 in FIG. 3. Referring collectively to FIG. 3 and the flowchart in FIG. 6, the method may begin in block 601.

Similar to the method of FIG. 5, clock signals from two clock generators, such as, e.g., a fast clock signal from fast clock generator 301 and a slow clock signal from slow clock generator 303, may be active. These clock signals may be received by a control circuit of a synchronizing system, such as control circuit 310. An enable signal, such as enable 322 may be in an asserted state which may indicate that a local version of the fast clock signal, e.g., local fast clock 335, and a gated version of the fast clock signal, e.g., gated fast clock 350, may both be enabled.

The method may depend upon a state of enable 322 (block 602). Logic 311 in control circuit 310 may determine that gated fast clock 350 is not currently needed and may be disabled, and in response may de-assert enable 322. The determination that gated fast clock 350 is not currently required may be made within logic 311. In other embodiments, the determination may depend upon one or more signals from another functional block in the system. If enable 322 is asserted, then the method may remain in block 602.

If enable 322 is de-asserted, then the method may synchronize enable 322 to local fast clock 335 (block 603). Synchronization unit 340 may be used to synchronize the transition of enable 322 from the asserted state to the de-asserted state. Enable 322 may be synchronized to local fast clock 335 for use by clock enable 345, generating synchronized enable 331.

Gated fast clock 350 may be disabled (block 604). The de-assertion of synchronized enable 331 may disable clock enable 345 and thereby disable gated clock 350. Local fast clock 335 may remain enabled.

Control circuit 310 may generate a delay lasting a predetermined period of time (block 605). The predetermined period of time may be dependent upon delay block 313 in some embodiments and, in other embodiments, logic 311 may utilize other means for generating the delay. For example, the delay may be dependent upon one or more clock cycles of the fast clock signal from fast clock generator 301. As stated above in relation to delay block 313 in FIG. 3, the predetermined period of time may be programmable and the amount of time may be determined during a factory test of the system or during normal operation.

Local fast clock 335 may be disabled (block 606). After the predetermined period of time elapses, control circuit 310 may disable local fast clock 335. A logic gate such as AND gate 319 may be used to disable local fast clock 335. In other embodiments, other suitable devices or circuits may be used to disable local fast clock 335. Disabling local fast clock 335 while gated fast clock is disabled may, in some embodiments, reduce power consumption and/or reduce switching noise in the system.

It is noted that the method illustrated in FIG. 6 is merely an example embodiment. In other embodiments, the method may include one or more addition operations or steps. As with the method illustrated in FIG. 5, the method illustrated in FIG. 6 is described in combination with system 300 in FIG. 3. In various other embodiments however, the method may be applied to the system 400 in FIG. 4 or alternative systems in which some or all of the control logic 310 is implemented in software, i.e., program instruction stored in a non-transitory machine-readable storage medium.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   circuitry configured to:
      generate a first enable signal dependent upon a first clock signal;
      generate a second clock signal in response to an assertion of the first enable signal, wherein a frequency of the second clock signal is greater than a frequency of the first clock signal; and
      determine that a first predetermined period has elapsed since a de-assertion of the first enable signal;
   a synchronization circuit configured to:
      generate a second enable signal synchronized to the second clock signal; and
      de-assert the second enable signal in response to a determination that the first enable signal has been de-asserted; and
   a clock gate circuit configured to:
      generate a third clock signal dependent upon the second clock signal; and
      disable the third clock signal in response to the de-assertion of the second enable signal;
   wherein the circuitry is further configured to disable the second clock signal in response to a determination that the first predetermined period of time has elapsed;
   wherein the circuitry includes a delay circuit, and wherein to determine that the first predetermined period of time has elapsed, the circuitry is further configured to delay the first enable signal using the delay circuit.

2. The apparatus of claim 1, wherein to determine that the first predetermined period of time has elapsed, the circuitry is further configured to determine that the second enable signal has been de-asserted.

3. The apparatus of claim 1, wherein the synchronization circuit includes a plurality of flip-flops.

4. The apparatus of claim 1, wherein the circuitry is further configured to:
   assert the first enable signal dependent upon the first clock signal; and
   generate the second clock signal in response to a determination that the first enable signal has been asserted, wherein:
      the synchronization circuit is further configured to assert the second enable signal in response to a determination that a second predetermined period of time has elapsed since the assertion of the first enable signal; and
      the clock gate circuit is further configured to enable the third clock signal in response to the assertion of the second enable signal.

5. The apparatus of claim 4, wherein the first predetermined period of time and the second predetermined period of time are equal.

6. An apparatus, comprising:
   circuitry configured to:
      generate a first enable signal dependent upon a first clock signal; and
      generate a second clock signal in response to an assertion of the first enable signal, wherein a frequency of the second clock signal is greater than a frequency of the first clock signal;
   a synchronization circuit configured to:
      generate a second enable signal synchronized to the second clock signal; and
      de-assert the second enable signal in response to a determination that the first enable signal has been de-asserted; and
   a clock gate circuit configured to:
      generate a third clock signal dependent upon the second clock signal; and
      disable the third clock signal in response to the de-assertion of the second enable signal;
   wherein the circuitry is further configured to disable the second clock signal in response to a determination that a first predetermined period of time has elapsed since the de-assertion of the first enable signal; and
   wherein the first predetermined period of time is programmable.

7. A method, comprising:
   generating a first enable signal dependent upon a first clock signal;
   generating a second clock signal in response to an assertion of the first enable signal, wherein a frequency of the second clock signal is greater than a frequency of the first clock signal
   generating a second enable signal, wherein the second enable signal is synchronized to the second clock signal;
   generating a third clock signal, dependent upon the second clock signal and the second enable signal;
   de-asserting the second enable signal in response to determining that the first enable signal has been de-asserted;
   disabling the third clock signal in response to de-asserting the second enable signal; and
   disabling the second clock signal in response to determining that a first predetermined period of time has elapsed since the de-assertion of the first enable signal;
   wherein determining that the first predetermined period of time has elapsed, comprises:
      de-asserting an input of a delay circuit in response to determining that the first enable signal has been de-asserted; and
      de-asserting an output signal of the delay circuit in response to determining that the first predetermined period of time has elapsed.

8. The method of claim 7, wherein determining that the first predetermined period of time has elapsed further comprises determining that the second enable signal has been de-asserted.

9. The method of claim 7, wherein disabling the second clock signal comprises disabling the second clock signal in response to de-asserting the output signal of the delay circuit.

10. The method of claim 7, further comprising:
   asserting the first enable signal dependent upon the first clock signal;
   enabling the second clock signal in response to asserting the first enable signal;
   asserting the second enable signal in response to determining that a second predetermined period of time has elapsed since asserting the first enable signal; and
   enabling the third clock signal in response to asserting the second enable signal.

11. The method of claim 10, wherein the first predetermined period of time and the second predetermined period of time are equal.

12. A method, comprising:
   generating a first enable signal dependent upon a first clock signal;
   generating a second clock signal in response to an assertion of the first enable signal, wherein a frequency of the second clock signal is greater than a frequency of the first clock signal generating a second enable signal, wherein the second enable signal is synchronized to the second clock signal;

generating a third clock signal, dependent upon the second clock signal and the second enable signal;

de-asserting the second enable signal in response to determining that the first enable signal has been de-asserted;

disabling the third clock signal in response to de-asserting the second enable signal; and disabling the second clock signal in response to determining that a first predetermined period of time has elapsed since the de-assertion of the first enable signal;

wherein the first predetermined period of time is programmable.

13. A system, comprising:

a first clock generation module configured to output a first clock signal;

a second clock generation module configured to output a second clock signal in response to an assertion of a first enable signal, wherein a frequency of the second clock signal is greater than a frequency of the first clock signal; and a synchronizing unit, coupled to the first clock generation module and the second clock generation module, wherein the synchronizing unit is configured to:

generate the first enable signal dependent upon the first clock signal;

generate a second enable signal, wherein the second enable signal is synchronized to the second clock signal;

enable a third clock signal, dependent upon the second clock signal and an assertion of the second enable signal;

de-assert the second enable signal in response to a determination the first enable signal has been de-asserted;

disable the third clock signal in response to de-asserting the second enable signal; and disable the second clock signal in response to a determination that a first predetermined period of time has elapsed since the de-assertion of the first enable signal;

wherein the synchronizing unit includes a delay circuit, and wherein to determine that the first predetermined period of time has elapsed, the synchronizing unit is further configured to delay the first enable signal using the delay circuit.

14. The system of claim 13, wherein to determine that the first predetermined period of time has elapsed, the synchronizing unit is further configured to determine that the second enable signal has been de-asserted.

15. The system of claim 13, wherein the synchronizing unit is further configured to:

assert the first enable signal dependent upon the first clock signal; and enable the second clock signal in response to asserting the first enable signal;

assert the second enable signal in response to a determination that a second predetermined period of time has elapsed since asserting the first enable signal; and enable the third clock signal in response to asserting the second enable signal.

16. The system of claim 15, wherein the first predetermined period of time and the second predetermined period of time are equal.

17. A system, comprising:

a first clock generation module configured to output a first clock signal;

a second clock generation module configured to output a second clock signal in response to an assertion of a first enable signal, wherein a frequency of the second clock signal is greater than a frequency of the first clock signal; and a synchronizing unit, coupled to the first clock generation module and the second clock generation module, wherein the synchronizing unit is configured to:

generate the first enable signal dependent upon the first clock signal;

generate a second enable signal, wherein the second enable signal is synchronized to the second clock signal;

enable a third clock signal, dependent upon the second clock signal and an assertion of the second enable signal;

de-assert the second enable signal in response to a determination the first enable signal has been de-asserted;

disable the third clock signal in response to de-asserting the second enable signal; and disable the second clock signal in response to a determination that a first predetermined period of time has elapsed since the de-assertion of the first enable signal;

wherein the first predetermined period of time is programmable.

18. The apparatus of claim 3, wherein each flip-flop of the plurality of flip-flops is coupled to the second clock signal.

19. The method of claim 7, wherein generating the second enable signal includes coupling the second enable signal to at least one flip-flop circuit, and wherein the at least one flip-flop circuit is coupled to the second clock signal.

20. The system of claim 13, wherein the synchronization unit includes a plurality of flip-flops, and wherein each flip-flop of the plurality of flip-flops is coupled to the second clock signal.

* * * * *